(12) United States Patent
Katori et al.

(10) Patent No.: US 11,686,775 B2
(45) Date of Patent: Jun. 27, 2023

(54) BATTERY DIAGNOSTIC APPARATUS AND BATTERY DIAGNOSTIC METHOD

(71) Applicant: YOKOGAWA ELECTRIC CORPORATION, Tokyo (JP)

(72) Inventors: Kenji Katori, Musashino (JP); Noboru Yamaguchi, Musashino (JP); Satoru Ochiai, Musashino (JP); Yuudai Minagawa, Musashino (JP)

(73) Assignee: Yokosawa Electric Corporation, Musashino (JP)

( * ) Notice: Subject to any disclaimer, the term of this patent is extended or adjusted under 35 U.S.C. 154(b) by 55 days.

(21) Appl. No.: 17/161,061

(22) Filed: Jan. 28, 2021

(65) Prior Publication Data
US 2021/0239765 A1 Aug. 5, 2021

(30) Foreign Application Priority Data
Feb. 3, 2020 (JP) .................. 2020-016489

(51) Int. Cl.
| | |
|---|---|
| G06F 11/30 | (2006.01) |
| G01R 31/392 | (2019.01) |
| G01R 31/36 | (2020.01) |
| G01R 31/3835 | (2019.01) |
| G01R 31/388 | (2019.01) |
| G01R 31/374 | (2019.01) |

(52) U.S. Cl.
CPC ....... *G01R 31/392* (2019.01); *G01R 31/3646* (2019.01); *G01R 31/374* (2019.01); *G01R 31/388* (2019.01); *G01R 31/3835* (2019.01)

(58) Field of Classification Search
CPC .................................................. G01R 31/392
See application file for complete search history.

(56) References Cited

U.S. PATENT DOCUMENTS

| | | | |
|---|---|---|---|
| 2006/0271315 A1 | 11/2006 | Cargonja et al. | |
| 2013/0103240 A1* | 4/2013 | Sato .................. | H02J 7/007192 |
| | | | 701/22 |

(Continued)

FOREIGN PATENT DOCUMENTS

| | | |
|---|---|---|
| JP | 3-203523 A | 9/1991 |
| JP | 4-346072 A | 12/1992 |

(Continued)

*Primary Examiner* — Phuong Huynh
(74) *Attorney, Agent, or Firm* — Sughrue Mion, PLLC (57) ABSTRACT

A battery diagnostic apparatus and a battery diagnostic method that are capable of accurately determining a deteriorated state of a battery and enabling use of the battery immediately before or near the end of the battery life are provided. The battery diagnostic apparatus includes a power supply monitoring unit 5 configured to detect that a power supply voltage has changed from less than a predetermined voltage to equal to or more than the predetermined voltage, and a controller 4 configured to measure a battery voltage in a predetermined period after the detection that the power supply voltage is equal to or more than the predetermined voltage, calculate electric power associated with a remaining capacity of the battery 1 based on the battery voltage, and perform deterioration determination of the battery 1 based on the electric power associated with the remaining capacity of the battery 1.

10 Claims, 5 Drawing Sheets

(56) References Cited

U.S. PATENT DOCUMENTS

2014/0338181 A1 11/2014 Allgaier et al.
2015/0171655 A1 6/2015 Venkataramani et al.

FOREIGN PATENT DOCUMENTS

| | | | |
|---|---|---|---|
| JP | 5-88153 | U | 11/1993 |
| JP | 7-260905 | A | 10/1995 |
| JP | 11-283677 | A | 10/1999 |
| JP | 2000-224701 | A | 8/2000 |
| JP | 2001-161001 | A | 6/2001 |
| JP | 2006-105611 | A | 4/2006 |
| JP | 2007-280935 | A | 10/2007 |
| JP | 2009-063460 | A | 3/2009 |
| JP | 2010-11530 | A | 1/2010 |
| JP | 6462214 | B2 * | 1/2019 |
| JP | 6462214 | B2 | 1/2019 |
| WO | 01/69273 | A2 | 9/2001 |

* cited by examiner

BATTERY DIAGNOSTIC APPARATUS AND BATTERY DIAGNOSTIC METHOD

CROSS REFERENCE TO RELATED APPLICATION

This application claims priority to and the benefit of Japanese Patent Application No. 2018-016489 (filed on Feb. 3, 2020), the entire contents of which are incorporated herein by reference.

TECHNICAL FIELD

The present disclosure relates to a battery diagnostic apparatus and a battery diagnostic method.

BACKGROUND

For an apparatus equipped with a battery, two methods described below are mainly used to determine a state in which a remaining capacity of the battery is lower than a predetermined value (hereinafter, referred to as a deteriorated state). One of the methods is a charge consumption integration method used by a firmware of the apparatus. This is a method for determining the deteriorated state of the battery by using a full capacity (nominal capacity) of the battery and a charged amount consumed in each operation as fixed values and performing integration of a charged amount consumed by the apparatus. The other one of the methods is a periodic diagnosis internal resistance method (e.g., PTL 1). The periodic diagnosis internal resistance method is a method for determining the deteriorated state of the battery by periodically measuring an internal resistance of the battery and comparing a measured internal resistance with a predetermined threshold.

CITATION LIST

Patent Literature

PTL 1: JP-A-2009-63460

SUMMARY

A battery diagnostic apparatus according to some embodiments includes:

a power supply monitoring unit configured to detect that a power supply voltage has changed from less than a predetermined voltage to equal to or more than the predetermined voltage; and a controller configured to measure a battery voltage in a predetermined period after the detection that the power supply voltage is equal to or more than the predetermined voltage, calculate electric power associated with a remaining capacity of the battery, based on the battery voltage, and perform deterioration determination of the battery, based on the electric power associated with the remaining capacity of the battery.

A battery diagnostic method according to some embodiments includes:

a step of detecting that a power supply voltage has changed from less than a predetermined voltage to equal to or more than the predetermined voltage;

a step of measuring a battery voltage in a predetermined period after the detection that the power supply voltage has changed to equal to or more than the predetermined voltage, and calculating electric power associated with a remaining capacity of a battery, and a step of performing deterioration determination of the battery based on the electric power associated with the remaining capacity.

DETAILED DESCRIPTION

A charge consumption integration method requires calculation of a consumed charged amount using a full capacity of a battery and a charged amount used for each operation as fixed values. However, the charged amount used for each operation varies depending on a type of a battery, a storage environment, a usage environment, and the like. Thus, accurately determining a deteriorated state of the battery can be difficult.

Also, because in the periodic diagnosis internal resistance method a threshold is set in consideration of variations in elements, there is a risk that a timing for deterioration detection may deviate greatly from an ideal deterioration detection timing, depending on each element used in an apparatus. Further, to accurately calculate an internal resistance of the battery, an ambient temperature and a current load need to be highly accurately calculated. This increases a circuit scale and the cost.

As such, the present disclosure aims to provide a battery diagnostic apparatus and a battery diagnostic method that are capable of accurately determining a deteriorated state of a battery and enabling use of the battery immediately before or near the end of the battery life.

A battery diagnostic apparatus according to some embodiments includes:

a power supply monitoring unit configured to detect that a power supply voltage has changed from less than a predetermined voltage to equal to or more than the predetermined voltage; and a controller configured to measure a battery voltage in a predetermined period after the detection that the power supply voltage is equal to or more than the predetermined voltage, calculate electric power associated with a remaining capacity of the battery, based on the battery voltage, and perform deterioration determination of the battery, based on the electric power associated with the remaining capacity of the battery.

As described above, the battery diagnostic apparatus according to some embodiments measure the battery voltage after a CPU is reset and performs the deterioration determination of the battery, based on electric power that can be supplied calculated using the battery voltage. Thus, the deteriorated state of the battery can be accurately determined, and the battery can be used until immediately before or near the end of the battery life.

In one embodiment, the controller determines that the battery is in a deteriorated state when the electric power associated with the remaining capacity of the battery is less than a threshold, and the battery diagnostic apparatus may include an output unit configured to output an alert when it is determined that the battery is in the deteriorated state.

As described above, the controller compares the electric power of the battery that can be supplied with the threshold and determines that the battery is in the deteriorated state when the electric power associated with the remaining capacity of the battery is less than the threshold. Thus, the deteriorated state of the battery can be accurately determined, and the battery can be used until immediately before or near the end of the battery life.

In one embodiment, the controller may determine that the battery is in a deteriorated state when the electric power associated with the remaining capacity of the battery is continuously detected to be less than the threshold for a predetermined number of times.

In this way, the controller compares the power that can be supplied to the battery with the threshold and determines that the battery is in a deteriorated state when the power associated with the remaining capacity of the battery is continuously detected to be less than the threshold for the predetermined number of times. Thus, the deteriorated state of the battery can be accurately determined, and the battery can be used until immediately before or near the end of the battery life.

In one embodiment, the battery is a lithium thionyl chloride primary battery and, when power associated with the remaining capacity of the battery is detected to be less than the threshold or continuously detected to be less than the threshold for a predetermined number of times, the controller may perform the deterioration determination, based on electric power re-calculated using a battery voltage measured after the flow of a refresh current.

As described above, in a case in which the battery is a lithium thionyl chloride primary battery, the deterioration determination is performed after the flow of the refresh current in an attempt to recover the battery. Thus, the deteriorated state of the battery can be more accurately determined, and the battery can be used until immediately before or near the end of the battery life.

In one embodiment, the controller may shift an operation mode of the battery diagnostic apparatus to a power saving mode when the controller determines that the battery is in a deteriorated state.

As described above, because the controller reduces the power consumption by shifting the operation mode of the battery diagnostic apparatus to the power saving mode when the controller determines that the battery is in the deteriorated state, the remaining capacity of the battery can be effectively utilized, regardless of the deteriorated state of the battery.

In one embodiment, the controller may be configured to compare the electric power associated with the remaining capacity of the battery with a plurality of threshold levels, classify a deterioration degree of the battery into levels, and change the operation mode of the battery diagnostic apparatus according to the deterioration degree.

As described above, because the controller is configured to change the operation mode of the apparatus according to the deterioration degree of the battery and reduce the power consumption, the remaining capacity of the battery can be effectively utilized according to the deterioration degree.

In one embodiment, the controller may be configured to further perform the deterioration determination based on an open circuit voltage of the battery.

As described above, because the deterioration determination of the battery is performed using the open circuit voltage of the battery, the deteriorated state of the battery can be determined more accurately, and the battery can be used until immediately before or near the end of the battery life.

In one embodiment, the controller may be configured to further determine whether to perform the deterioration determination based on a transition of the electric power associated with the remaining capacity of the battery that is periodically measured.

As described above, because whether to perform the deterioration determination of the battery is determined using the transition of the electric power associated with the remaining capacity of the battery, insufficient consideration of the battery aging can be suppressed.

In one embodiment, the controller may be configured to further determine whether to perform the deterioration determination based on an ambient temperature of the battery.

By determining whether to perform the deterioration determination of the battery based on the ambient temperature of the battery, insufficient consideration of a temperature change can be suppressed.

A battery diagnostic method according to some embodiments includes:

a step of detecting that a power supply voltage has changed from less than a predetermined voltage to equal to or more than the predetermined voltage;

a step of measuring a battery voltage in a predetermined period after the detection that the power supply voltage has changed to equal to or more than the predetermined voltage, and calculating electric power associated with a remaining capacity of a battery, and a step of performing deterioration determination of the battery based on the electric power associated with the remaining capacity.

As described above, because the battery voltage is measured after the CPU is reset and the deterioration determination of the battery is performed based on electric power that can be supplied calculated using the battery voltage, the deteriorated state of the battery can be determined more accurately, and the battery can be used until immediately before or near the end of the battery life, as compared to conventional methods.

According to the present disclosure, the battery diagnostic apparatus and the battery diagnostic method that are capable of more accurately determining a deteriorated state of a battery and enabling use of the battery until immediately before or near the end of the battery life can be provided.

Hereinafter, a battery diagnostic apparatus 10 according to an embodiment of the present disclosure will be described with reference to the drawings. First, a configuration of the battery diagnostic apparatus 10 according to the present embodiment will be described with reference to FIG. 1.

Figure 1:
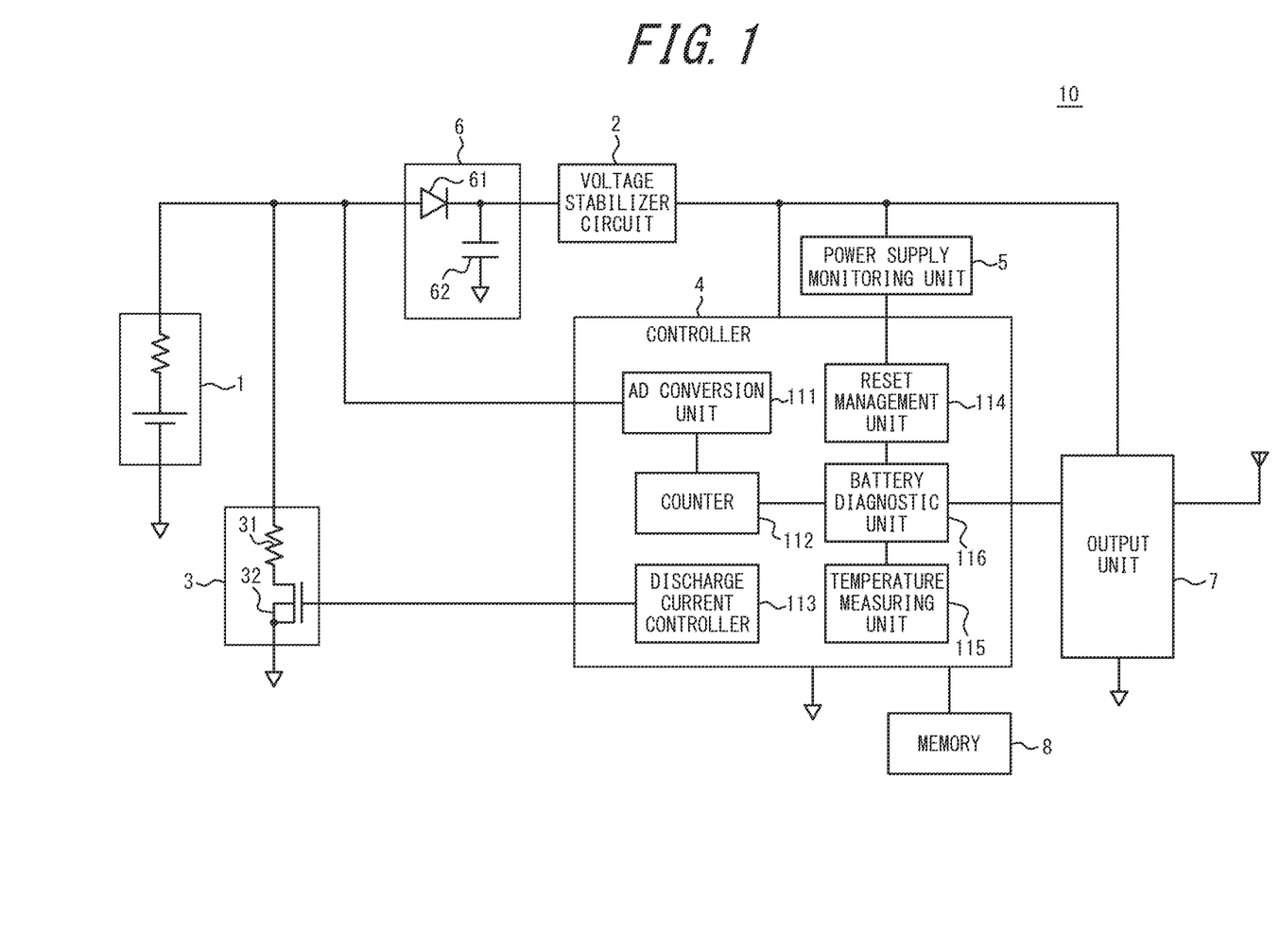
FIG. 1 is a functional block diagram illustrating a battery diagnostic apparatus according to an embodiment of the present disclosure.

The battery diagnostic apparatus 10 according to the present embodiment includes a battery 1, a voltage stabilizer circuit 2, a load current circuit 3, a controller 4, a power supply monitoring unit 5, a constant voltage circuit primary side voltage maintaining means 6, an output unit 7, and a memory 8.

The battery 1 is, for example, a lithium thionyl chloride primary battery. Hereinafter, although the battery 1 will also be referred to as a thionyl chloride lithium primary battery 1 in the present embodiment, the type of battery is not limited thereto. In other words, the battery diagnostic apparatus 10 according to the present embodiment can diagnose a primary battery or a secondary battery of any kind. The lithium thionyl chloride primary battery 1 is connected to an input of the voltage stabilizer circuit 2 via the constant voltage circuit primary side voltage holding means 6. The thionyl chloride lithium primary battery 1 has characteristics such as having a high output voltage and low self-discharge and enabling a long-time usage and thus can be suitably used as a power source of a wireless apparatus used in plants or factories where stable operation is required for a long time. It is understood that, because the thionyl chloride lithium primary battery 1 mainly has three characteristics as described below, grasping a deteriorated state of the battery is difficult.

(1) A nominal capacity (e.g., a capacity in a full state) vastly varies according to an ambient temperature of the battery. For example, when the battery is stored in a high temperature environment, the nominal capacity drops to less than half.

(2) When the battery is used in a high temperature environment, a chloride film is formed within the battery, whereby an internal resistance is increased, and a voltage decreases when a large current is used. If an apparatus drastically shifts to a high load operation in this state, a desired voltage cannot be maintained, and a stable operation may not be maintained. In this case, the battery cannot be used even if a sufficient capacity remains in the battery.

(3) Because a substantially constant open circuit voltage is maintained until immediately before or near the running out of the battery capacity, grasping the deteriorated state by performing a battery voltage measurement is difficult.

As described above, because the nominal capacity of the lithium thionyl chloride primary battery 1 vastly varies according to the ambient temperature and the load conditions, the deteriorated state of the lithium thionyl chloride primary battery 1 cannot be accurately determined in an environment where the temperature changes drastically. Further, in a case in which the battery 1 deteriorates without increasing the internal resistance, the deteriorated state cannot be detected by a periodic diagnosis internal resistance method. The lithium thionyl chloride primary battery 1 has two battery deterioration modes: a first mode in which a chloride film grows and the internal resistance is increased and a second mode in which the open circuit voltage is reduced by an influence of the ambient temperature or the battery life. The periodic diagnosis internal resistance method cannot detect the second mode. Further, because the charge integration method subtracts a used charged amount from a full charged amount, it is difficult to accurately determine a deteriorated state using the charge integration method in a case in which a used battery or a battery having a poor storage state is mounted.

The voltage stabilizer circuit 2 converts an output voltage of the thionyl chloride lithium primary battery 1 into a predetermined voltage (e.g., 3.3 V) and outputs thus obtained voltage as a power supply to the controller 4, the power supply monitoring unit 5, the output unit 7, and the memory 8.

The load current circuit 3 includes a discharge resistor 31 and a discharge switch 32. The discharge switch 32 is switched ON or OFF, based on control by a discharge current controller 113, which will be described later. The discharge switch 32 is, for example, a FET (Field effect transistor). By switching the discharge switch 32 ON, the battery voltage under load (i.e., when a current is applied to the discharge resistor 31) is measured.

The controller 4 is a CPU (central processing unit) or constitutes a part of the CPU, and executes processing associated with an operation of the battery diagnostic apparatus 10 by controlling each element thereof. The controller 4 includes an AD conversion unit 111, a counter 112, a discharge current controller 113, a reset management unit 114, a temperature measuring unit 115, and a battery diagnostic unit 116.

The AD conversion unit 111 converts analog data of the battery voltage into digital data and passes the digital data to the counter 112. The counter 112 calculates electric power associated with a remaining capacity of the lithium thionyl chloride primary battery 1, based on the digital data received from the AD conversion unit 111. The electric power is calculated using the following formula (1):

$$Pbat = Vb^2/R \tag{1}$$

Pbat is electric power associated with the remaining capacity of the lithium thionyl chloride primary battery 1, Vb is a battery voltage under load, and R is a resistance value of the discharge resistance 31 of the load current circuit 3. The counter 112 passes the calculated power value (Pbat) to the battery diagnostic unit 116. Note that the Pbat is electric power that can be supplied from the lithium thionyl chloride primary battery 1 to the inside of the battery diagnostic apparatus 10.

The discharge current controller 113 switches ON or OFF the discharge switch 32 of the load current circuit 3. In this way, the controller 4 measures the battery voltage of the thionyl chloride lithium primary battery 1 under load. In particular, the discharge current controller 113 switches ON the discharge switch 32 after CPU reset executed due to a reduction in the power supply voltage. In this way, the controller 4 measures the battery voltage in a predetermined period subsequent to the CPU reset executed due to the reduction in the power supply voltage. The predetermined period is a period after the CPU reset and before normal startup. Alternatively, the predetermined period may be a period between after the CPU reset and before application of a refresh current. The refresh current is a current applied to reduce the internal resistance of the lithium thionyl chloride primary battery 1. At the time of initial startup, the discharge current controller 113 may switch ON the discharge switch 32 after the CPU reset executed due to a low voltage of the power supply voltage, which is near zero volt.

A reset management unit 114 executes the CPU reset (i.e., restart of the controller 4) when the power supply voltage decreases, based on a monitoring result by the power supply monitoring unit 5. The power supply monitoring unit 5 periodically monitors the power supply voltage of the apparatus. When executing the CPU reset, the reset management unit 114 stores the information associated with a cause of the CPU reset in the memory 8. In particular, the reset management unit 114 stores, for example, bit information associated with abnormal power supply in the memory 8. The reset management unit 114 can perform a similar operation also at the time of initial startup.

A temperature measuring unit 115 measures the ambient temperature of the lithium thionyl chloride primary battery 1 and passes a measured ambient temperature value to the battery diagnostic unit 116. The ambient temperature may be a temperature on the surface of the lithium thionyl chloride primary battery 1 or a temperature in the vicinity of the battery 1.

The battery diagnostic unit 116 performs deterioration determination of the thionyl chloride lithium primary battery 1, based on the Pbat received from the counter 112 and, optionally, the ambient temperature value received from the temperature measuring unit 115. Various methods can be employed for the deterioration determination. For example, the threshold associated with electric power may be compared with the Pbat and, when the Pbat is less than the threshold, the thionyl chloride lithium primary battery 1 may be determined to be in a deteriorated state. Such a threshold is a value determined by electric power of an operation necessary for the apparatus. For example, the threshold may be electric power necessary for an operation of the apparatus that requires the highest electric power. The threshold may be electric power necessary for an operation of at least some elements of the apparatus. The threshold may be a predetermined fixed value or determined by a calculation based on the ambient temperature value received from the temperature measuring unit 115.

The power supply monitoring unit 5 monitors the power supply voltage of the apparatus (e.g., an output voltage of the voltage stabilizer circuit 2). When the power supply voltage is less than a predetermined voltage, e.g., when the power supply monitoring unit 5 detects a decrease in the power supply voltage, or when the power supply monitoring unit 5 detects that the power supply voltage is equal to or more than the predetermined voltage, the power supply monitoring unit 5 passes the detection result to the reset management unit 114. The reset management unit 114 executes the CPU reset, based on the detection result. The power supply monitoring unit 5 can perform a similar operation also at the initial startup. Here, after the CPU reset means, for example, after the power supply monitoring unit 5 detects that the power supply voltage has changed from less than a predetermined voltage to equal to or more than the predetermined voltage.

The constant voltage circuit primary side voltage holding means 6 has a configuration in which a diode 61 and a capacitor 62 are combined together and supplies a drive current to the controller 4 when the battery voltage is measured. Further, a current is not applied to the load current circuit 3 from the capacitor 62, because of the diode 61. Thus, when the discharge switch 32 of the load current circuit 3 is ON, all the current supplied from the lithium thionyl chloride primary battery 1 flows through the load current circuit 3. In the constant voltage circuit primary side voltage holding means 6, a side connected to the battery 1 is a primary side, and a side connected to the voltage stabilizer circuit 2 is a secondary side.

The output unit 7 outputs data obtained by the operation of the battery diagnostic apparatus 10. In particular, when, for example, the controller 4 determines that the thionyl chloride lithium primary battery 1 is in a deteriorated state, the output unit 7 outputs an alert notifying the deteriorated state of the battery. The alert can take various modes. For example, the alert may indicate that a remaining battery level is low. The alert may indicate that the remaining battery level is, for example, 1%. The remaining battery level does not need to be a calculated value. For example, the remaining battery level simply needs to be a value that is low enough to encourage a user to replace the battery.

The output unit 7 may be a communication interface. The communication interface is, for example, a LAN interface, a WAN interface, an interface that supports mobile communication standards such as LTE (Long Term Evolution), 4G (4th generation), or 5G (5th generation), or an interface that supports short-range wireless communication. The communication interface may communicate with a higher-level system using a communication protocol generally used in industrial products (e.g., ISA100, LoRa communication, Fieldbus/Profibus, HART, Brain, etc.). The higher-level system notifies the user of an alert, based on the alert output from the output unit 7. For example, the higher-level system may output and display that the remaining battery level is 1%.

Further, the output unit 7 may be a display, a speaker, or the like. The display is, for example, an LCD (liquid crystal display) or an organic EL (electroluminescence) display. In a case in which the output unit 7 is a display, the output unit 7 may display an icon indicating a decrease in battery power, such that a field worker can easily identify the apparatus in which the battery 1 should be replaced.

The memory 8 includes at least one semiconductor memory, at least one magnetic memory, at least one optical memory, or a combination of at least two of them. The semiconductor memory is, for example, a RAM (random access memory) or a ROM (read only memory). The RAM is, for example, a SRAM (static random access memory) or a DRAM (dynamic random access memory). The ROM is, for example, an EEPROM (electrically erasable programmable read only memory), FlashROM, or FRAM (Ferroelectric RAM). The memory 8 functions as, for example, a main storage apparatus, an auxiliary storage apparatus, or a cache memory. The memory 8 stores data to be used for the operation of the battery diagnostic apparatus 10 and data obtained by the operation of the battery diagnostic apparatus 10.

Figure 2:
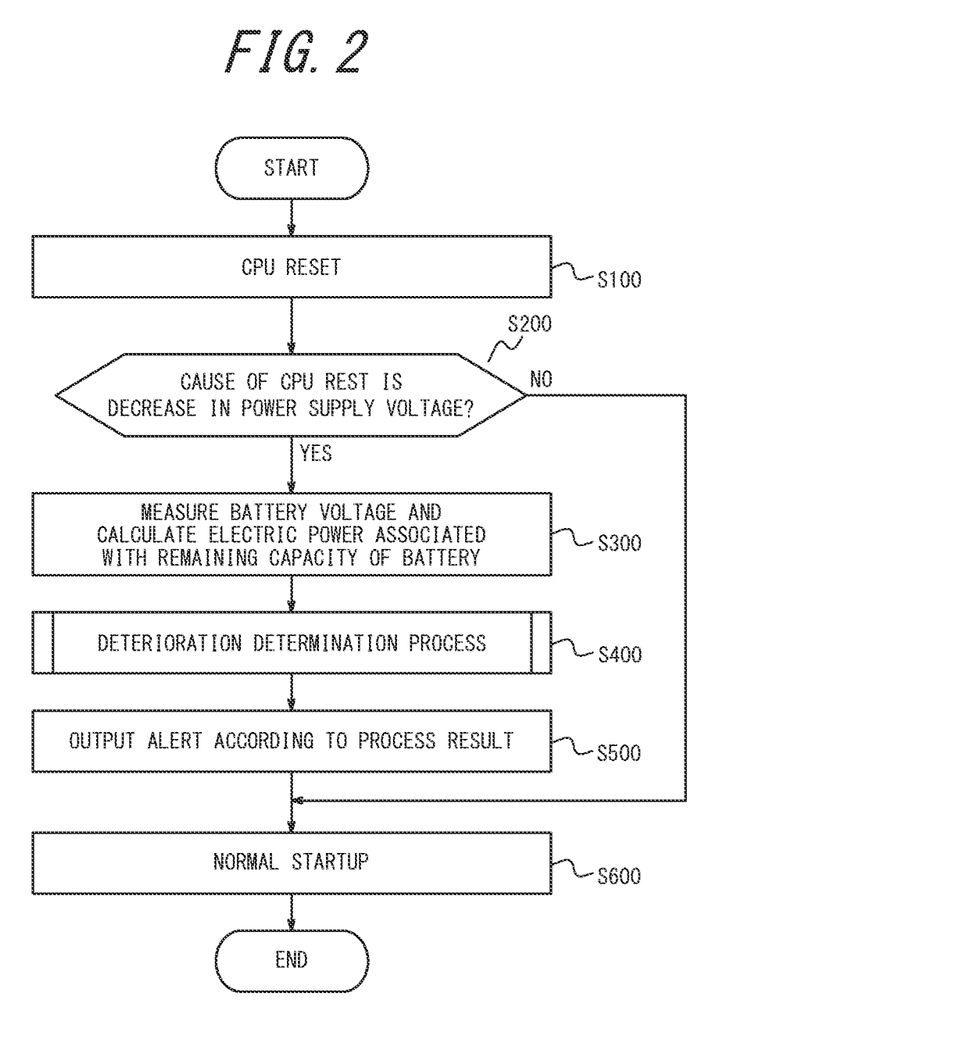
FIG. 2 is a flowchart illustrating a battery diagnostic method according to an embodiment of the present disclosure.

Next, a battery diagnostic method executed by the battery diagnostic apparatus 10 according to the embodiment of the present disclosure will be described. FIG. 2 illustrates a flowchart associated with the battery diagnosis method according to the embodiment of the present disclosure.

First, the reset management unit 114 of the controller 4 resets the CPU when the reset management unit 114 detects a decrease in the power supply voltage of the apparatus or detects that the power supply voltage is equal to or more than the predetermined voltage, based on the monitoring result by the power supply monitoring unit 5 (step S100). When the reset management unit 114 executes the CPU reset, the reset management unit 114 stores the information associated with the cause of the CPU reset in the memory 8. In particular, the reset management unit 114 stores, for example, the bit information associated with the abnormal power supply in the memory 8.

Next, the controller 4 determines whether the cause of the CPU reset is a decrease in the power supply voltage (step S200). In particular, the controller 4 refers to the bit information associated with the abnormal power supply stored in the memory 8 and determines the cause of the CPU reset. In a case in which the controller 4 determines that the cause of the CPU reset is a decrease in the power supply voltage, the process proceeds to step S300. In a case in which the controller 4 determines that the cause of the CPU reset is not a decrease in the power supply voltage, the process proceeds to step S600.

When the controller 4 determines that the cause of the CPU reset is a decrease in the power supply voltage, the controller 4 measures the battery voltage (e.g., the output voltage of the voltage stabilizer circuit 2) and calculates electric power that can be supplied (step S300). In particular, the discharge current controller 113 switches ON the discharge switch 32 of the load current circuit 3 after the CPU reset. In this way, the controller 4 measures the battery voltage of the thionyl chloride lithium primary battery 1 under load in the predetermined period subsequent to the CPU reset. The AD conversion unit 111 converts the analog data of the battery voltage into digital data and passes the digital data to the counter 112. The counter 112 calculates electric power associated with the remaining capacity of the lithium thionyl chloride primary battery 1, based on the digital data received from the AD conversion unit 111. The electric power is calculated using the above equation (1).

Figure 3:
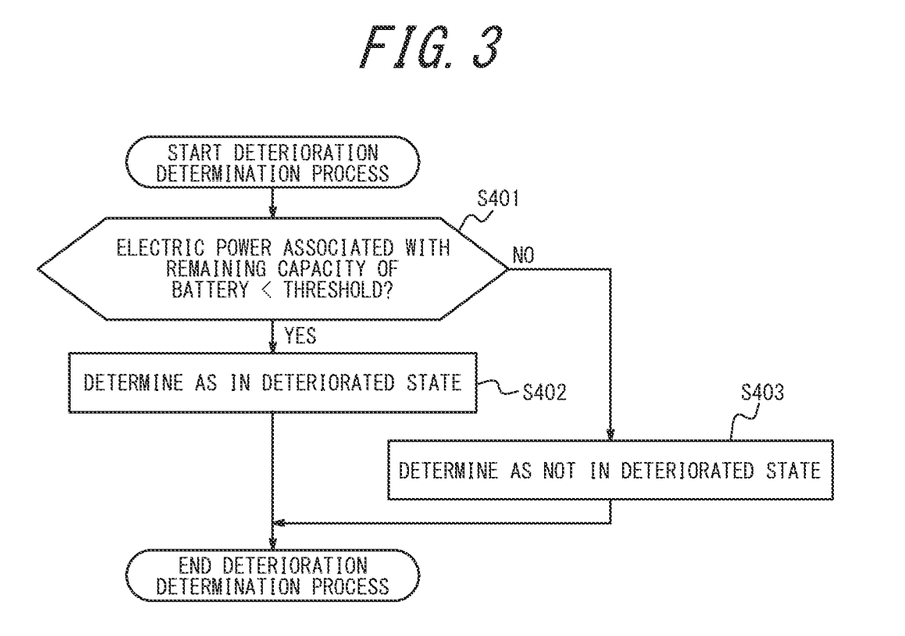
FIG. 3 is a flowchart illustrating an example of a deterioration determination process.

The battery diagnostic unit 116 performs a deterioration determination process of the thionyl chloride lithium primary battery 1, based on the Pbat received from the counter 112 and, optionally, the ambient temperature value received from the temperature measuring unit 115 (step S400). FIG. 3 illustrates an example of the deterioration determination process. In step S401, the battery diagnostic unit 116 compares the electric power (Pbat) associated with the remaining capacity calculated using the battery voltage with the threshold associated with electric power and determines the deteriorated state, based on whether the Pbat is less than the threshold. When the Pbat is less than the threshold, the battery diagnostic unit 116 determines that the thionyl chloride lithium primary battery 1 is in a deteriorated state (step S402), and the deterioration determination process ends. On the other hand, when the Pbat is not less than the threshold in step S401, the battery diagnostic unit 116 determines that the thionyl chloride lithium primary battery 1 is not in a deteriorated state (step S403), and the deterioration determination process ends.

Referring again to FIG. 2, the output unit 7 outputs an alert according to the result of the deterioration determination process (step S500). In particular, when the controller 4 determines that the thionyl chloride lithium primary battery 1 is in a deteriorated state, the output unit 7 outputs an alert notifying the deteriorated state of the battery. On the other hand, the output unit 7 does not output such an alert when the controller 4 determines that the lithium thionyl chloride primary battery 1 is not in a deteriorated state. The alert can take various modes. For example, the alert may indicate that the remaining battery level is low. The alert may indicate that the remaining battery level is, for example, 1%. The remaining battery level does not need to be a calculated value. For example, the remaining battery level simply needs to be a value that is low enough to encourage the user to replace the battery. Then, the controller 4 performs normal startup of the apparatus (step S600), and the process ends. For example, after normal startup, the battery diagnostic apparatus 10 may transmit data based on sensor data obtained from a built-in sensor or an external sensor (not illustrated) to a higher-level system or the like via the output unit 7. Further, after the normal startup, the battery diagnostic apparatus 10 may receive various setting data from the higher-level system or the like via the output unit 7 and store the various setting data in the memory 8.

According to the present embodiment, as described above, the battery voltage is measured after the CPU reset, and the controller 4 performs the deterioration determination of the battery 1, based on electric power that can be supplied calculated using the battery voltage. Thus, a deteriorated state of the battery 1 can be accurately determined. Further, the controller 4 compares electric power of the battery that can be supplied with the threshold and, when electric power associated with the remaining battery level of the battery 1 is less than the threshold, causes the output unit 7 to output the alert. Thus, the user can be promptly alerted immediately before or near the end of the battery life, as compared to conventional methods, such that the user can replace the battery 1 immediately before or near the end of the battery life. According to the present embodiment, in other words, the battery 1 can be used until immediately before or near the end of the battery life, as compared to conventional methods.

Although the present disclosure has been described based on the figures and the embodiments, it should be appreciated that those who are skilled in the art may easily perform variations or alteration based on the present disclosure. Accordingly, such variations and alterations are to be included in the scope of the present disclosure. For example, the functions included in each of the means or steps may be rearranged avoiding a logical inconsistency, such that a plurality of means or steps are combined, or one means or step is subdivided.

Figure 4:
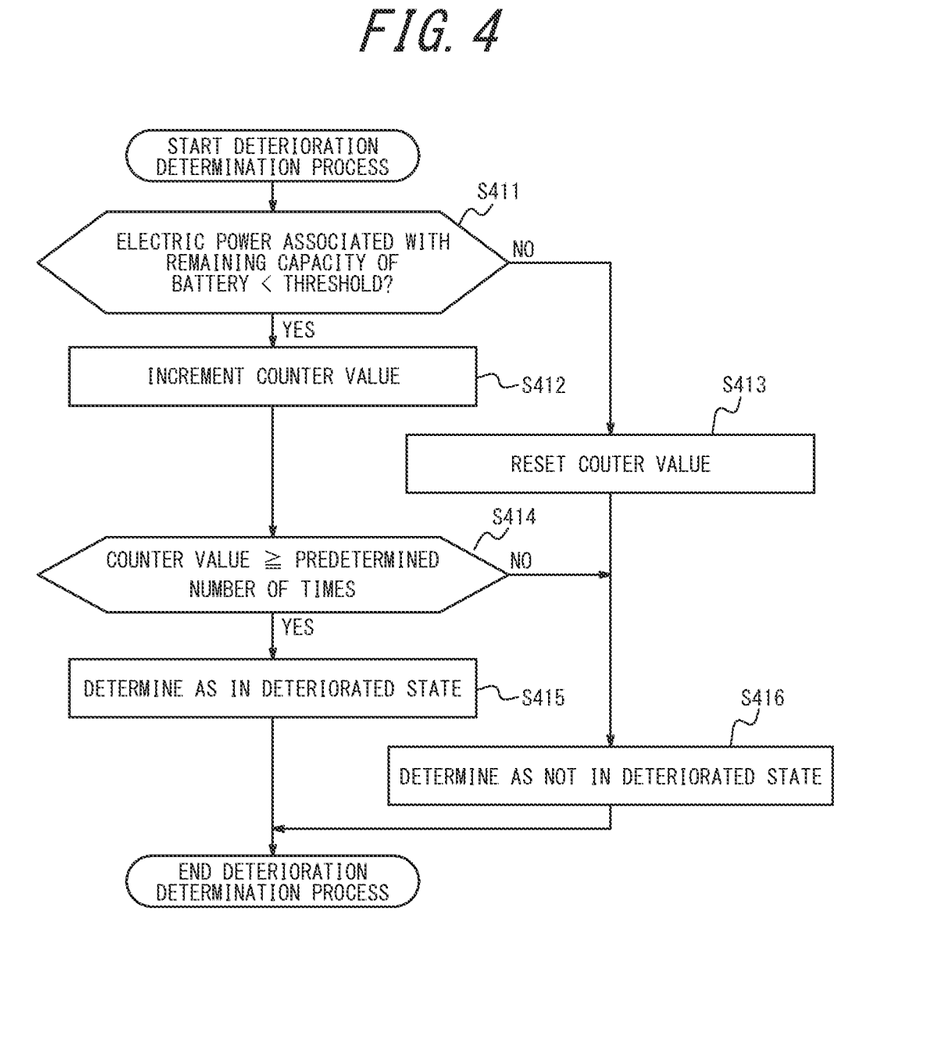
FIG. 4 is a flowchart illustrating a deterioration determination process according to a first example variation.

In a first example variation, for example, when electric power associated with the remaining capacity of the battery 1 continuously falls under the threshold for a predetermined number of times, the controller 4 may determine that the thionyl chloride primary battery 1 is in a deteriorated state in a deterioration determination process. FIG. 4 is a flowchart illustrating the deterioration determination process according to the first example variation.

First, the battery diagnostic unit 116 determines whether the electric power (Pbat) associated with the remaining capacity of the battery 1 calculated using the battery voltage is less than the threshold (step S411). In a case in which the Pbat is less than the threshold, the battery diagnostic unit 116 increments a counter value (step S412). The counter value indicates the number of times when electric power associated with the remaining capacity of the battery 1 is continuously detected to be less than the threshold. For example, the counter value indicates the number of times when the process in step S412 is continuously executed based on the determination in step S411. The counter value is stored in the memory 8.

After step S412, the battery diagnostic unit 116 determines whether the counter value is equal to or more than a predetermined number of times (step S414). In a case in which the counter value is equal to or more than the predetermined number of times, the process proceeds to step S415. In this case, the battery diagnostic unit 116 determines that the lithium thionyl chloride primary battery 1 is in a deteriorated state (step S415), and the deterioration determination process ends.

In a case in which the counter value is not more than the predetermined number of times in step S414, the battery diagnostic unit 116 determines that the thionyl chloride lithium primary battery 1 is not in a deteriorated state (step S416), and the deterioration determination process ends.

In a case in which the Pbat is more than the threshold in step S411, the battery diagnostic unit 116 resets the counter value (step S413). Then, the battery diagnostic unit 116 determines that the battery 1 is not in a deteriorated state (step S416), and the deterioration determination process ends.

As described above, the controller 4 compares the electric power that can be supplied by the battery with the threshold and, when the electric power associated with the remaining capacity of the battery 1 is continuously detected to be less than the threshold for the predetermined number of times, causes the output unit 7 to output the alert. Thus, the user can be promptly alerted further immediately before the end of the battery life, and the lithium thionyl chloride primary battery 1 can be replaced immediately before or near the battery life.

Figure 5:
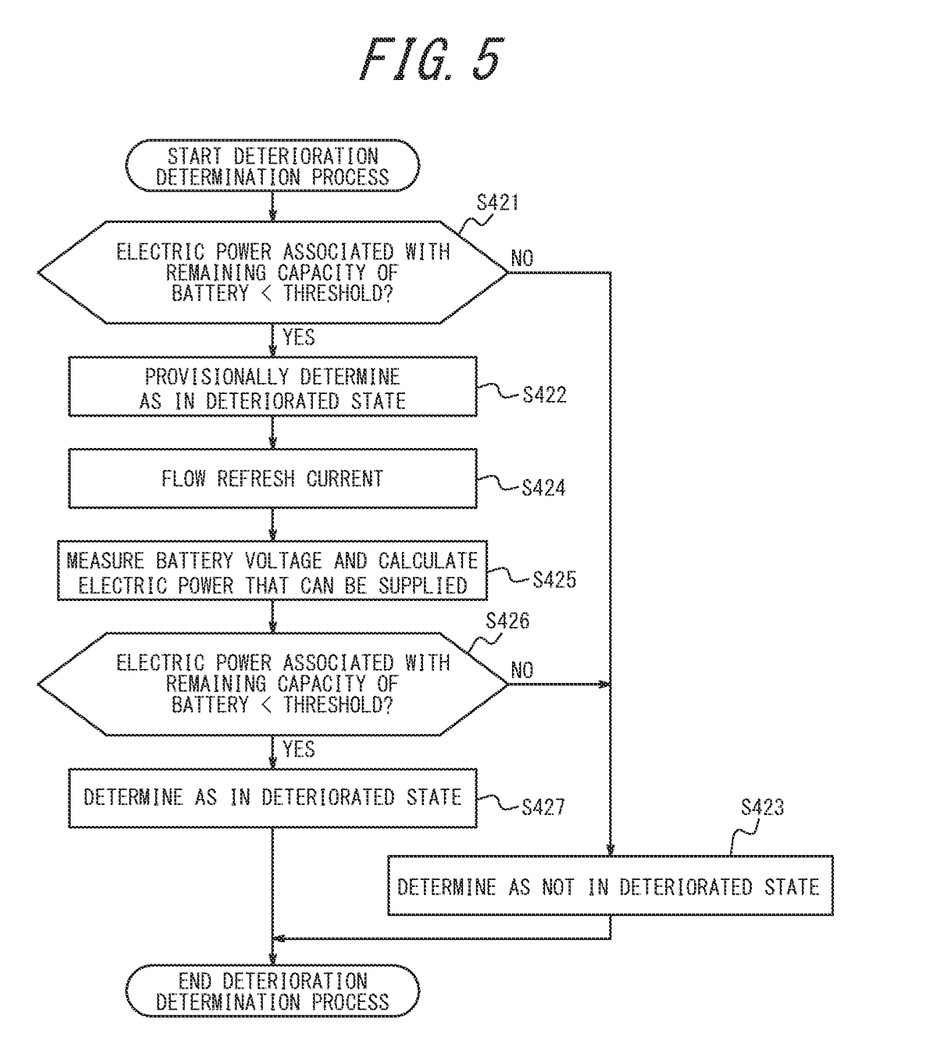
FIG. 5 is a flowchart illustrating a deterioration determination process according to a second example variation.

In a second example variation, for example, when the electric power associated with the remaining capacity of the battery 1 is less than the threshold in a deterioration determination process, the controller 4 may apply a refresh current in an attempt to recover and then determine the deteriorated state of the battery 1, based on recalculated electric power. Generally, the battery 1 has an internal resistance, which increases as the battery 1 deteriorates. In a case in which a brand new battery has not been used for a long time (i.e., in a case in which a current is not flown), the internal resistance tends to increase due to environmental conditions (e.g., extremely high temperature or low temperature, or a drastic temperature change). An effect is known that, when the battery 1 has a sufficient charged amount, a film accumulated in the battery 1 can be destroyed and the internal resistance can be reduced by forcibly flowing a current (a refresh current) from the battery 1 to discharge the battery 1. Thus, the battery 1 may be forcibly discharged after the determination that the battery 1 is in a deteriorated state, and then the diagnosis may be performed again for a final deterioration determination. FIG. 5 is a flowchart illustrating the deterioration determination process according to the second example variation.

First, the battery diagnostic unit 116 determines whether the electric power (Pbat) associated with the remaining capacity of the battery 1 calculated using the battery voltage is less than the threshold (step S421). In a case in which the Pbat is less than the threshold, the battery diagnostic unit 116 provisionally determines that the battery 1 is in a deteriorated state (step S422). On the other hand, when the Pbat is not less than the threshold, the battery diagnostic unit 116 determines that the thionyl chloride lithium primary battery 1 is not in a deteriorated state (step S423), and the deterioration determination process ends.

Subsequent to step S422, the controller 4 flows a refresh current through the lithium thionyl chloride primary battery 1 (step S424). Then, the controller 4 stops the refresh current, measures the battery voltage, and calculates the electric power that can be supplied (step S425). In particular, the discharge current controller 113 flows the refresh current using, for example, a circuit (not illustrated) for flowing the refresh current and then switches ON the discharge switch 32 of the load current circuit 3. The load current circuit 3 may be used as the circuit for flowing the refresh current. In this way, the controller 4 measures the battery voltage of the thionyl chloride lithium primary battery 1 under load after the flow of the refresh current. The AD conversion unit 111 converts the analog data of the battery voltage into digital data and passes the digital data to the counter 112. The counter 112 calculates electric power associated with the remaining capacity of the lithium thionyl chloride primary battery 1, based on the digital data received from the AD conversion unit 111. The electric power is calculated using the above equation (1).

Subsequently, the battery diagnostic unit 116 determines whether the electric power (Pbat) associated with the remaining capacity of the battery 1 calculated using the battery voltage is less than the threshold (step S426). In a case in which the Pbat is less than the threshold, the battery diagnostic unit 116 determines that the thionyl chloride lithium primary battery 1 is in a deteriorated state (step S427), and the deterioration determination process ends. On the other hand, when the Pbat is not less than the threshold, the battery diagnostic unit 116 determines that the thionyl chloride lithium primary battery 1 is not in a deteriorated state (step S423), and the deterioration determination process ends.

As described above, the electric power associated with the remaining capacity of the lithium thionyl chloride primary battery 1 is calculated based on the battery voltage at the time when the refresh current is flown through the battery after the CPU reset in an attempt to recover the lithium thionyl chloride primary battery 1, and then the controller 4 performs the deterioration determination. This enables further accurate determination of a deteriorated state of the lithium thionyl chloride primary battery 1. Further, because the refresh current is flown in an attempt to recover the battery 1 by removing films accumulated within the battery and reduce the internal resistance, the battery life of the battery 1 can be extended.

Note that the number of the times to perform the operation in which the refresh current is flown and the re-diagnosis is performed may be limited. In particular, the controller 4 may count the number of times in which the refresh current is flown and, when the number of times in which the refresh current is flown reaches a certain value, the controller 4 may determine that the thionyl chloride lithium primary battery 1 is in a deteriorated state, without performing the recovery after provisionally determining the deteriorated state.

In a third example variation, in FIG. 1 to FIG. 4, for example, when the controller 4 determines that the battery 1 is in a deteriorated state, the controller 4 may shift the operation mode of the apparatus from a normal operation mode to a power saving mode. For example, the normal operation mode is an operation mode in which all functions included in the apparatus are operated, and the power saving mode is an operation mode in which some functions included in the apparatus are operated while other functions are stopped. The battery 1 in the deteriorated state cannot always be replaced immediately. Thus, when the battery 1 is in a deteriorated state, the controller 4 may control to shift to the power saving mode, whereby the battery life before replacement can be extended. The function to be stopped in the power saving mode may be a wireless communication function. For example, after the output unit 7 outputs an alert using wireless communication, the controller 4 may stop normal communication (e.g., transmission of an output value of a sensor, etc.). As a result, the power consumption of the apparatus can be reduced. Further, the function to be stopped in the power saving mode may be a measuring function. For example, the controller 4 may change a temperature measuring cycle by the temperature measuring unit 115. In a case in which, for example, the measuring unit is in normal operation in a 10-minute cycle, the controller 4 may change the cycle to a 24-hour cycle. The power consumption can be saved by the controller 4 changing the operation cycle of the measuring unit as described above. The functions to be restricted in the power saving mode are not limited to the communication function and the measuring function, and any other functions included in the apparatus may be restricted.

In a fourth example variation, in FIG. 1 to FIG. 4, for example, a plurality of threshold levels of electric power may be provided to be used for the deterioration determination of the battery 1. In particular, the controller 4 may set a plurality of thresholds as a plurality of threshold levels, compare the plurality of thresholds with the electric power associated with the remaining capacity of the battery 1, and classify a deterioration degree of the battery 1 into the threshold levels. Further, the controller 4 may limit functions that can be used, depending on the deterioration degree of the battery 1. In other words, the controller 4 may classify the deterioration degree of the battery 1 by comparing the electric power associated with the remaining capacity of the battery 1 with the plurality of threshold levels and change the operation mode of the apparatus according to the deterioration degree. Each element of the apparatus uses different electric power. For example, electric power consumed by the wireless communication unit, the measuring unit, and the memory is respectively assumed to be 50 mW, 30 mW, and 10 mW. In this case, by setting three thresholds according to these power consumptions, the controller 4 classifies deterioration degrees of the battery 1 according to each threshold and stops a function that is restricted by each level in changing the operation mode, such that an operation of the apparatus can be temporarily continued. Because the controller 4 reduces power consumption by changing the operation mode of the apparatus according to the deterioration degree of the battery, the remaining capacity of the battery 1 can be effectively utilized according to the deterioration degree. For example, when the remaining capacity is less than 50 mW, the function of the wireless communication unit is stopped.

In a fifth example variation, in FIG. 1 to FIG. 4 and in the third and fourth example variations, for example, the controller 4 may measure a battery voltage (hereinafter, referred to as an open circuit voltage) leaving the switch of the load current circuit 3 OFF and perform the deterioration determination based also on the open circuit voltage. In other words, the controller 4 may perform the deterioration determination of the battery 1, based on the electric power associated with the remaining capacity of the battery 1 and the open circuit voltage. For example, the controller 4 may measure the open circuit voltage of the battery 1 and, when the open circuit voltage is equal to or lower than the threshold level, the controller 4 may cause the output unit 7 to output an alert to notify that the battery 1 is close to the end of the battery life, even when the electric power associated with the remaining capacity of the battery 1 is equal to or more than the threshold. By performing the deterioration determination of the battery 1 also using the open circuit voltage of the battery 1 as described above, the deteriorated state of the battery 1 can be determined more accurately.

In a sixth example variation, in FIG. 1 to FIG. 4 and in the third and fourth example variations, for example, the controller 4 may predict a trend of a decrease in the electric power by periodically measuring electric power and use the trend as a criterion for the deterioration determination of the battery 1. In particular, the controller 4 may determine whether to perform the deterioration determination process, based on the trend of the decrease in the electric power, before performing the deterioration determination process in step S400 illustrated in FIG. 2. In this way, a diagnosis can be made taking aging into consideration. For example, it is known that a brand new battery and a used battery have different measured power values and, as the deterioration progresses, the measured power values approximate to a determined value. In a case in which such a change is not observed, it may be affected by a sudden environmental change or operational mistakes made by the user. In this case, the controller 4 may postpone the deterioration determination of the battery 1 to prevent insufficient consideration of aging. In other words, the controller 4 may determine whether to perform the deterioration determination of the battery 1, based on a transition of the electric power associated with the remaining capacity of the battery 1 that is periodically measured. By determining whether to perform the deterioration determination of the battery 1 using the transition of the electric power associated with the remaining capacity of the battery 1 as described above, insufficient consideration of aging can be suppressed. The controller 4 may cause the output unit 7 to output an alert based on the transition to prompt the battery replacement in advance. Further, the controller 4 may store the aging estimated from the trend in the memory 8.

In a seventh example variation, in FIG. 1 to FIG. 4 and the third to sixth example variations, for example, when a drastic temperature change occurs, electric power of the battery 1 can be temporarily reduced. Thus, when a drastic temperature change is detected, the controller 4 may postpone the deterioration determination, to prevent insufficient consideration of the temperature change. In other words, the controller 4 may determine whether to perform the deterioration determination, based on the ambient temperature of the battery 1. In particular, the controller 4 may determine whether to perform the deterioration determination process, based on the ambient temperature of the battery 1, before performing the deterioration determination process in step S400 illustrated in FIG. 2. By determining whether to perform the deterioration determination of the battery 1 based on the ambient temperature of the battery 1 as described above, insufficient consideration of the temperature change can be suppressed. Also, for example, in an environmental condition (e.g., the temperature, a vibration, etc.) exceeding a specification range of the product, the controller 4 may postpone the deterioration determination. Further, when such a condition is detected, the controller 4 may cause the output unit 7 to output an alert notifying that the environmental condition exceeds a usage range.

The invention claimed is:

1. A battery diagnostic apparatus comprising:
a power supply monitoring unit configured to detect that a power supply voltage has changed from less than a predetermined voltage to equal to or more than the predetermined voltage; and
a controller configured to measure a battery voltage of a battery in a predetermined period after the detection that the power supply voltage is equal to or more than the predetermined voltage, calculate electric power associated with a remaining capacity of the battery based on the battery voltage, and perform deterioration determination of the battery based on the electric power associated with the remaining capacity of the battery,
wherein the predetermined period after the detection that the power supply voltage is equal to or more than the predetermined voltage is a period after reset and before normal startup.

2. The battery diagnostic apparatus according to claim 1, wherein the controller is configured to determine that the battery is in a deteriorated state when the electric power associated with the remaining capacity of the battery is less than a threshold, and
comprising an output unit configured to output an alert when the battery is determined to be in the deteriorated state.

3. The battery diagnostic apparatus according to claim 2, wherein the controller is configured to determine that the battery is in the deteriorated state when the electric power associated with the remaining capacity of the battery becomes less than the threshold for a predetermined number of times.

4. The battery diagnostic apparatus according to claim 2, wherein the battery is a lithium thionyl chloride primary battery, and
when the electric power associated with the remaining capacity of the battery is less than the threshold or becomes less than the threshold for a predetermined number of times, the controller is configured to perform the deterioration determination based on electric power re-calculated using a power supply voltage measured after application of a refresh current.

5. The battery diagnostic apparatus according claim 1, wherein the controller is configured to shift an operation mode of the battery diagnostic apparatus when the controller determines that the battery is in a deteriorated state.

6. The battery diagnostic apparatus according to claim 1, wherein the controller is configured to compare the electric power associated with the remaining capacity of the battery with a plurality of threshold levels, classify a deterioration degree of the battery into levels, and change an operation mode of the battery diagnostic apparatus according to the deterioration degree.

7. The battery diagnostic apparatus according to claim 1, wherein the controller is further configured to perform the deterioration determination based on an open circuit voltage of the battery.

8. The battery diagnostic apparatus according to claim 1, wherein the controller further determines whether to perform the deterioration determination based on a transition of the electric power associated with the remaining capacity of the battery that is periodically measured.

9. The battery diagnostic apparatus according to claim 1, wherein the controller further determines whether to perform the deterioration determination based on an ambient temperature of the battery.

10. A battery diagnostic method comprising:

a step of detecting that a power supply voltage has changed from less than a predetermined voltage to equal to or more than the predetermined voltage;

a step of measuring a battery voltage of a battery in a predetermined period after the detection that the power supply voltage is equal to or more than the predetermined voltage, and calculating electric power associated with a remaining capacity of the battery; and a step of performing deterioration determination of the battery based on the electric power associated with the remaining capacity of the battery, wherein the predetermined period after the detection that the power supply voltage is equal to or more than the predetermined voltage is a period after reset and before normal startup.

* * * * *